(12) United States Patent
Smythe et al.

(10) Patent No.: US 10,319,586 B1
(45) Date of Patent: Jun. 11, 2019

(54) METHODS COMPRISING AN ATOMIC LAYER DEPOSITION SEQUENCE

(71) Applicant: Micron Technology, Inc., Boise, ID (US)

(72) Inventors: John A. Smythe, Boise, ID (US); Woohee Kim, Seoul (KR); Stefan Uhlenbrock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/860,388

(22) Filed: Jan. 2, 2018

(51) Int. Cl.
*C23C 16/34* (2006.01)
*C23C 16/40* (2006.01)
*C23C 16/46* (2006.01)
*H01L 21/02* (2006.01)
*C23C 16/455* (2006.01)

(52) U.S. Cl.
CPC ........ *H01L 21/0228* (2013.01); *C23C 16/345* (2013.01); *C23C 16/401* (2013.01); *C23C 16/45527* (2013.01); *C23C 16/46* (2013.01); *H01L 21/0214* (2013.01); *H01L 21/0217* (2013.01); *H01L 21/02164* (2013.01); *H01L 21/02172* (2013.01)

(58) Field of Classification Search
CPC .............. C23C 16/45527; H01L 21/0228
See application file for complete search history.

(56) References Cited

U.S. PATENT DOCUMENTS 4,237,473 A   12/1980  Chiang
5,138,407 A   8/1992   Hirtz et al.
5,930,611 A   7/1999   Okamoto
(Continued)

OTHER PUBLICATIONS

Kotulak, "Growth and Anaylsis of Gallium Phosphide on Silicon for Very High Efficiency Solar Cells", A thesis submitted by the Faculty of the Univ. of Delaware in partial fulfillment of the requirements for the degree of Master of Science in Electrical and Computer Engineering, Univ. of Delaware, 2011, 83 pages.
Manna et al., "A Novel Si/SiGe Sandwich Polysilicon TFT for SRAM Applications", IEEE, Jun. 19-21, 1995, United States, pp. 156-157.
(Continued)

*Primary Examiner* — Farun Lu
(74) *Attorney, Agent, or Firm* — Wells St. John P.S.

(57) ABSTRACT

An example method comprises an ALD sequence including contacting an outer substrate surface at a temperature T1 with a first precursor to form a monolayer onto the outer substrate surface. Temperature of the outer substrate surface and the monolayer thereon is increased to a temperature T2 that is at least 200° C. greater than a maximum of the temperature T1. The temperature-increasing is at a temperature-increasing rate that takes no more than 10 seconds to get the outer substrate surface and the monolayer thereon at least 200° C. above the maximum temperature T1. At the temperature T2, the monolayer is contacted with a second precursor that reacts with the monolayer to form a reaction product and a new outer substrate surface that each comprise a component from the monolayer and a component from the second precursor. With the monolayer not having been allowed to be at least 200° C. above the maximum temperature T1 for more than 10 seconds, temperature of the new outer substrate surface is decreased from the temperature T2 to a lower temperature TL that is at least 200° C. lower than a minimum of the temperature T2.

58 Claims, 5 Drawing Sheets

(56) References Cited

U.S. PATENT DOCUMENTS

| | | |
|---|---|---|
| 7,071,065 B1 | 7/2006 | Xiang et al. |
| 7,125,815 B2 | 10/2006 | Vaartstra |
| 7,393,783 B2 | 7/2008 | Derderian |
| 7,537,804 B2 | 5/2009 | Srividya et al. |
| 7,544,388 B2 | 6/2009 | Sarigiannis et al. |
| 7,851,307 B2 | 12/2010 | Ramaswamy et al. |
| 8,163,341 B2 | 4/2012 | Quick et al. |
| 8,431,459 B2 | 4/2013 | Takenaka et al. |
| 8,481,122 B2 | 7/2013 | Carlson et al. |
| 8,518,486 B2 | 8/2013 | Mirin et al. |
| 8,536,621 B2 | 9/2013 | Dewey et al. |
| 8,748,269 B2 | 6/2014 | Dewey et al. |
| 8,823,011 B2 | 9/2014 | Chan |
| 9,499,907 B2 | 11/2016 | Song et al. |
| 2006/0216894 A1 | 9/2006 | Parekh et al. |
| 2007/0246803 A1 | 10/2007 | Haller |
| 2008/0085587 A1 | 4/2008 | Wells |
| 2009/0179227 A1 | 7/2009 | Otake et al. |
| 2010/0105192 A1* | 4/2010 | Akae ............... C23C 16/45525 438/478 |
| 2010/0276668 A1 | 11/2010 | Ko et al. |
| 2011/0108885 A1 | 5/2011 | Sazawa et al. |
| 2011/0227145 A1 | 9/2011 | Renn |
| 2012/0080753 A1 | 4/2012 | Singh et al. |
| 2012/0298958 A1 | 11/2012 | Dewey et al. |
| 2013/0149830 A1 | 6/2013 | Rhee et al. |
| 2013/0193400 A1 | 8/2013 | Sandhu et al. |
| 2013/0337623 A1 | 12/2013 | Dewey et al. |
| 2015/0028406 A1 | 1/2015 | Tang et al. |
| 2015/0091060 A1 | 4/2015 | Yang et al. |
| 2017/0345927 A1 | 11/2017 | Cantoro et al. |

OTHER PUBLICATIONS

Ozturk, "Source/Drain Junctions and Contacts for 45 nm CMOS and Beyond", North Carolina State University Department of Electrical and Computer Engineering, 2005 International Conference on Characterization and Metrology for USLI Technology, 2005, United States, 34 pages.

Pal et al., "Electrical Characterization of GaP-Silicon Interface for Memory and Transistor Applications", IEEE Tranactions on Electron Devices, vol. 60, No. 7, Jul. 2013, United States, pp. 2238-2245.

Sun, "Power Metal-Oxide-Semiconductor Field-Effect Transistor With Strained Silicon and Silicon Germanlum Channel", A Dissertation Sumitted for the Degree of Doctor of Philosophy in the Dept. of Elec. Eng. in the College of Eng. and Comp. Science, Univ. of Florida, 2010, 104 pgs.

U.S. Appl. No. 15/898,086, filed Feb. 15, 2018, by Gao et al.

U.S. Appl. No. 15/890,147, filed Feb. 6, 2018, by Ranaswamy.

Baliga et al. "Seminconductors for high-voltage, vertical channel field effect transistors", Journal of Applied Physics 53(3), Mar. 1982, United States, pp. 1759-1764.

Kang et al., "Change in Electrical Characteristics of Gallium Phosphide Nanowire Transistors Under Different Environments", 4th IEEE Conference on Nanotechnology, Aug. 16-19, 2004, Published in United States, pp. 370-372.

Pal et al., "Addressing Key Challenges in 1T-DRAM: Rention Time, Scaling and Varability—Using a Novel Disign with GaP Source-Drain", IEEE, 2013, United States, pp. 376-379.

U.S. Appl. No. 15/843,402, filed Dec. 15, 2017, by Carlson et al.

U.S. Appl. No. 15/848,982, filed Dec. 20, 2017, by Ramaswamy.

U.S. Appl. No. 62/537,842, filed Jul. 27, 2017, by Sandhu et al.

\* cited by examiner

METHODS COMPRISING AN ATOMIC LAYER DEPOSITION SEQUENCE

TECHNICAL FIELD

Embodiments disclosed herein pertain to atomic layer deposition.

BACKGROUND

Insulative silicon-containing oxides (e.g., $SiO_2$, silicates, silicon-oxynitrides, etc.) are used in numerous constructions of integrated circuitry. Such may be used to laterally or elevationally separate different components of integrated circuitry. Additionally, such materials may be used within individual integrated circuit components. For example, such materials may be used as some or all of a capacitor insulator of a capacitor. Additionally, such materials may be used as some or all of a gate insulator of a field effect transistor. Further, such may be used in whole or in part as programmable material in a memory cell or as another part of a memory cell.

Insulative silicon oxide-containing insulator materials may be formed in many manners. For example, such may be formed by chemical vapor deposition (CVD), atomic layer deposition (ALD), and by thermal oxidation of an outermost region of a substrate that comprises silicon. Silicon-containing oxides formed by oxidation of silicon typically form what are considered as very high-quality oxides that are desired to be used in parts of integrated circuit components such as those referred to above. However, as integrated circuitry density has increased and therewith the size of individual circuit components has decreased, the thickness of silicon-containing insulative oxides has become thinner as well. It can be difficult to form very thin layers of silicon-containing insulative oxides by thermal oxidation without consuming significant quantities of underlying elemental silicon, for example consuming at least 10 Angstroms of silicon and in many instances much more. This can be problematic in many instances.

While the inventions described herein were motivated in addressing the above-identified issues, all aspects of the inventions are not necessarily so limited.

DETAILED DESCRIPTION OF EXAMPLE EMBODIMENTS

Embodiments of the invention encompass methods comprising an ALD sequence having at least four steps that are acted upon a substrate, namely, and in the following temporal order, [a] a contacting step, [b] a temperature-increasing step, [c] another contacting step, and [d] a temperature-decreasing step, for example as described below. The substrate acted upon may be subjected to processing before and/or after the above ALD sequence. Regardless, processing of the substrate (e.g., relative to a processing chamber within which the substrate is received) may occur between any two of [a], [b], [c], and [d] in such ALD sequence. Regardless, the [a], [b], [c], and [d] ALD sequence may be repeated, and individual components within such sequence need not be the same as a previous sequence and/or sequences. Accordingly, "repeated" and "repeating" herein with respect to a minimum four-step ALD sequence do not require individual of the steps to be identical with one or more steps in an earlier minimum four-step ALD sequence. Example embodiments of a method comprising an ALD sequence in accordance with the invention are initially described with reference to FIGS. 1-8.

Figure 1:
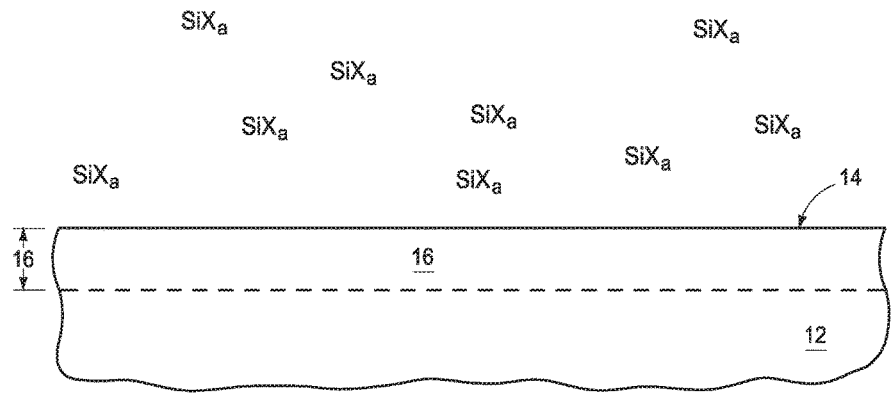
FIG. 1 is a diagrammatic cross-sectional view of a portion of a substrate in process in accordance with an embodiment of the invention

Referring to FIG. 1, a substrate or substrate fragment 12 in process comprises an outer substrate surface 14. Substrate 12 may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 12 would, by way of example, be part of a larger substrate, for example a semiconductor wafer which would be positioned within any suitable existing or yet-to-be-developed processing chamber within which one or more substrates being processed can be received, exposed to processing substances, and which allow temperature of a changing outer substrate surface 14 to be controlled and rapidly changed in accordance with the following description.

FIG. 1 shows an act of processing whereby outer substrate surface 14, which in one embodiment is at a substrate temperature T1 that is at or below 650° C., has been contacted with a Si-comprising precursor $SiX_a$ (e.g., which may be considered, and in some embodiments is referred to, as a first precursor $P_1$). In one embodiment, the temperature T1 is no lower than 20° C. The example Si-comprising precursor is shown as comprising molecular-like $SiX_a$ having example molecular entities of Si and X, and where "a" is any number (not necessarily an integer) greater than 0. Si-comprising precursor $SiX_a$ by way of example, may be electrically neutral, an ion, a radical, etc., and may be in any one or more of liquid, vapor, or plasma state(s). In one embodiment, the Si-comprising precursor is in a gaseous state, and in one embodiment is in a plasma state. Si-comprising precursors SiX$_a$ may be organic or inorganic, for example comprising one or more of an organosilane, an aminosilane, an alkoxysilane, a silane diamine, and a guanidine of silane. Some specific examples include neopentasilane, trisilane, trisilylamine, hexamethylcyclotrisilazane, bis(t-butyl-amino)silane, hexakis(dimethylamido)disilazane, triminotriazine, bis-(diethyl-amino)silane, tris(dimethylamino)silane, tris(dimethylamino)chlorosilane, (di-methylamino)trimethyl silane, (diethylamino)triethyl silane, 3-aminopropyl-triethoxysilane, tris(tert-butoxy)silanol, and tris(tert-pentoxy)silanol.

In one embodiment, substrate 12 comprises an outermost region 16 comprising, consisting essentially of, or consisting of elemental-form Si, for example monocrystalline and/or polycrystalline silicon which may be doped or undoped with conductivity-modifying impurity. Outer substrate surface 14 may comprise, consist essentially of, or consist of elemental-form Si. Alternately, outer substrate surface 14 may not contain any elemental-form Si (e.g., and in one embodiment no Si in molecular or other form), and may in one example be hydroxyl-terminated (i.e., be —OH).

Figure 2:
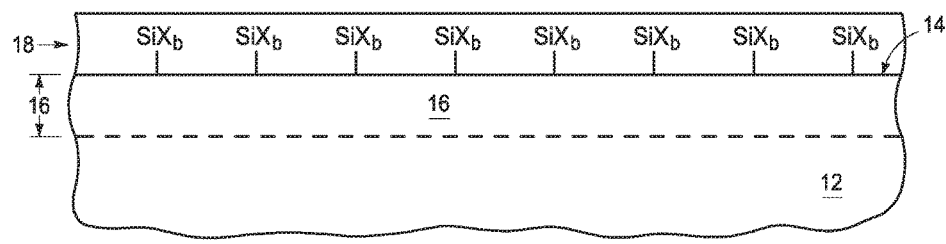
FIG. 2 is a view of the FIG. 1 substrate at a processing step subsequent to that shown by FIG. 1.

Referring to FIG. 2, the example act of contacting outer substrate surface 14 with Si-comprising precursor SiX$_a$ in FIG. 1 has been sufficient to form a monolayer 18 comprising Si from Si-comprising precursor SiX$_a$ onto outer substrate surface 14 (FIGS. 1 and 2 collectively showing an example contacting step [a] referred to above). Si-comprising precursor SiX$_a$ of FIG. 1 is shown as having been attached to outer substrate surface 14 as an example species SiX$_b$, for example where "b" might be some number (not necessarily an integer) which is a value from and inclusive of zero to some number less than "a". Accordingly, species SiX$_b$ may be some altered form of SiX$_a$, for example wherein the attaching is by one or more of adsorption and chemisorption. Alternately, the species attached to outer substrate surface 14 in FIG. 2 may be SiX$_a$ (not shown), for example where attaching of the species occurs by one or more of physisorption or absorption.

FIG. 2 shows Si-comprising precursor SiX$_a$ (not shown) from FIG. 1 as not being above substrate 12, although monolayer 18 would of course form in the presence of some Si-comprising precursor SiX$_a$ above substrate 12. Si-comprising precursor SiX$_a$ will likely at some point be evacuated from a chamber within which substrate 12 (e.g., FIG. 2) is received by stopping flow of SiX$_a$ to such chamber and which may include flowing of an inert gas to purge SiX$_a$ from being in such chamber prior to any one or more subsequent processing acts (e.g., prior to a temperature-increasing step [b] referred to above, and/or during such a temperature-increasing step [b]). Monolayer 18 may be continuous or discontinuous on outer substrate surface 14, and regardless may be saturated where it is on outer substrate surface 14 (e.g., more/longer exposure of surface 14 to Si-comprising precursor results in no further addition of SiX$_a$ and/or SiX$_b$ to surface 14).

The processing shown by FIG. 1 to produce a structure as shown in FIG. 2 may occur under any suitable existing or yet-to-be-developed conditions at or below 650° C. Example conditions include a pressure range from 100 mTorr to 20 Torr, Si-comprising precursor flow rate from 200 sccm to 15 liters per minute. Any suitable time of exposure (i.e., contacting) of outer substrate surface 14 of FIG. 1 to/with the Si-comprising precursor to form monolayer 18 of FIG. 2 may be used, with lower times-of-exposure being preferred at least for purpose of maximizing production. An example such exposure/contacting time is from 5 to 20 seconds.

In one embodiment, the temperature T1 is constant during all of the contacting of outer substrate surface 14 with the Si-comprising precursor, and in another embodiment is not constant during all of the contacting of outer substrate surface 14 with the Si-comprising precursor. In this document, "constant" with respect to temperature is defined as within a range of 3.00 in degrees C., and including being exactly constant (i.e., held within 0.00° C.). If the temperature T1 is not exactly constant, the temperature T1 will have some maximum value and some minimum value during all of the contacting of outer substrate surface 14 with the Si-comprising precursor. In one embodiment, and regardless of whether the temperature T1 is constant, the temperature T1 is within 10% in degrees C. of the maximum and the minimum of the temperature T1 during all of the contacting of outer substrate surface 14 with the Si-comprising precursor. In another embodiment where the temperature T1 is not constant during all of the contacting of outer substrate surface 14 with the Si-comprising precursor, the maximum and the minimum of the temperature T1 during most of the contacting of outer substrate surface 14 with the Si-comprising precursor are each more than 10% in degrees C. from the middle value between the maximum and the minimum of the temperature T1. For example, and by way of example only, if the temperature T1 is variable between 400° C. and 500° C., a midpoint thereof is 450° C. with 10% thereof being 45° C. The 400° C. and 500° C. are each 50° C. away from middle value 450° C., and accordingly are more than 10% in degrees C. from such middle value. An example wherein temperature T1 is within 10% in degrees C. of the maximum and the minimum of the temperature T1 is a T1 temperature range of from 425° C. to 475° C.

In one embodiment, the temperature T1 is no greater than 500° C. In one embodiment, the temperature T1 is no less than 350° C. during at least some, and in one embodiment during all, of the contacting of outer substrate surface 14 with the Si-comprising precursor to form monolayer 18. In one embodiment, the temperature T1 is at least 100° C. during all of the contacting of outer substrate surface 14 with the Si-comprising precursor to form monolayer 18. Regardless, in one embodiment the inventive method is devoid of contacting outer substrate surface 14 with any Si-comprising precursor at a temperature above 650° C. Such may preclude decomposition or detachment of the Si-comprising precursor or other precursor relative to outer substrate surface 14.

The temperature(s) of outer substrate surface 14 and Si-comprising monolayer 18 thereon is increased to a temperature T2 that is in one embodiment at least 100° C. greater than the maximum of the temperature T1 and is greater than 650° C. And, the temperature-increasing is at a temperature-increasing rate that takes no more than 10 seconds to get outer substrate surface 14 and Si-comprising monolayer 18 thereon above 650° C. (e.g., collectively a temperature-increasing step [b] as referred to above). At the temperature T2, and referring to FIG. 3, Si comprising monolayer 18 is contacted with an O and/or N-comprising precursor P$_2$ (e.g., a second precursor P$_2$) that reacts with Si-comprising monolayer 18 to form a reaction product 20 (FIG. 4) and a new outer substrate surface 22 that each comprise an insulative material 24 comprising Si from monolayer 18 (FIG. 3) and at least one of O and N from the O and/or N-comprising precursor P$_2$ (e.g., FIGS. 3 and 4 collectively showing an example another contacting step [c] as referred to above). Example such insulative material 24 is abbreviated as shown in FIG. 4 as Si[O/N]. Precursor P$_2$ may be may organic or inorganic, and may be electrically neutral, an ion, a radical, etc., and may be in any one or more of liquid, vapor, or plasma state(s). In one embodiment, the Si-comprising precursor is in a gaseous state, and in one embodiment is in a plasma state.

In one embodiment, the O and/or N-comprising precursor $P_2$ comprises O and insulative material 24 of reaction product 20 and new outer substrate surface 22 comprises O from the O-comprising precursor (e.g., insulative material 24 comprising, consisting essentially of, or consisting of $SiO_2$). In one embodiment the O and/or N-comprising precursor $P_2$ comprises N and insulative material 24 of reaction product 20 and new outer substrate surface 22 comprises N from the N-comprising precursor $P_2$ (e.g., insulative material 24 comprising, consisting essentially of, or consisting of $Si_3N_4$). Some example $P_2$ precursors include $O_2$, $O_3$, $H_2O_2$, $H_2O$ $NH_3$, and $N_2H_4$. In one embodiment, the O and/or N-comprising precursor $P_2$ comprises O and N (e.g., $N_2O$, NO, and/or $NO_x$), and insulative material 24 of reaction product 20 and new outer substrate surface 22 comprise O and N from the O and/or N-comprising precursor $P_2$ (e.g., comprising, consisting essentially of, or consisting of a silicon oxynitride).

Figure 3:
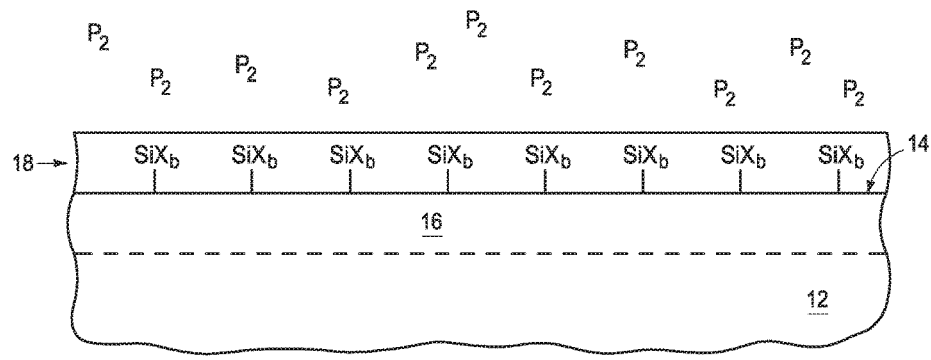
FIG. 3 is a view of the FIG. 2 substrate at a processing step subsequent to that shown by FIG. 2.
Figure 4:
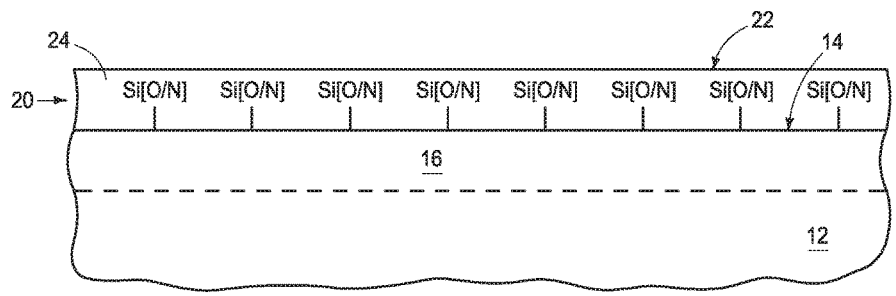
FIG. 4 is a view of the FIG. 3 substrate at a processing step subsequent to that shown by FIG. 3.
Figure 5:
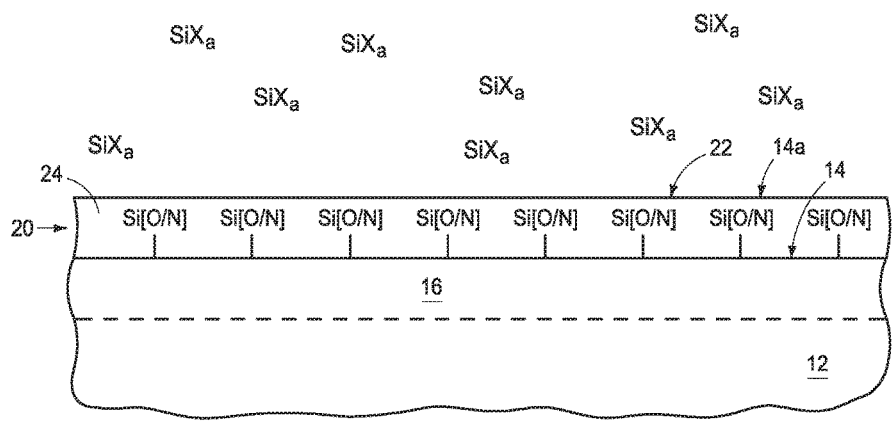
FIG. 5 is a view of the FIG. 4 substrate at a processing step subsequent to that shown by FIG. 4.
Figure 6:
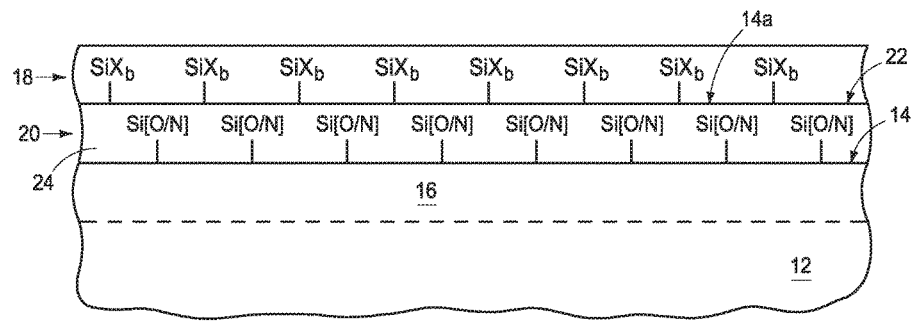
FIG. 6 is a view of the FIG. 5 substrate at a processing step subsequent to that shown by FIG. 5.
Figure 7:
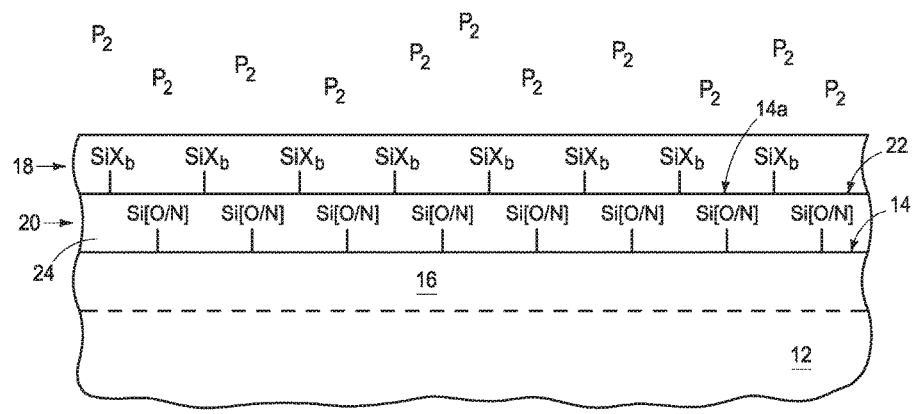
FIG. 7 is a view of the FIG. 6 substrate at a processing step subsequent to that shown by FIG. 6.

FIG. 4 shows precursor $P_2$ (not shown) from FIG. 3 as not being above substrate 12, although reaction product 20 would of course form in the presence of some precursor $P_2$ above substrate 12. Precursor $P_2$ will likely at some point be evacuated from a chamber within which substrate 12 is received by stopping flow of precursor $P_2$ to such chamber and which may include flowing of an inert gas to purge precursor $P_2$ from being in such chamber prior to one or more subsequent processing acts (e.g., prior to a temperature-decreasing step [d] referred to above, and/or during such a temperature-decreasing step [d]). Reaction product 20 may be continuous or discontinuous on outer substrate surface 14, and regardless may be saturated where it is on outer substrate surface 14 (e.g., more/longer exposure of monolayer 18 to $P_2$ results in no further formation of addition of reaction product 20).

In one embodiment, the temperature T2 is constant during all of the contacting of monolayer 18 with the O and/or N-comprising precursor $P_2$, and in an alternate embodiment is not constant during all of the contacting of monolayer 18 with the O and/or N-comprising precursor $P_2$. In one embodiment, the temperature T2 is within 10% in degrees C. of the minimum and the maximum of the temperature T2 during all of the contacting of monolayer 18 with the O and/or N-comprising precursor $P_2$. In one embodiment, the minimum and the maximum of the temperature T2 during most of the contacting of monolayer 18 with the O and/or N-comprising precursor $P_2$ are each more than 10% in degrees C. from the middle value between the maximum and the minimum of the temperature T2. In one embodiment, the temperature T2 is at least 750° C., and in one embodiment is no more than 1,000° C. In one embodiment, the temperature T2 is at least 200° C. above, and in one embodiment at least 300° C. above, the maximum of the temperature T1.

In one embodiment, monolayer 18 is contacted with the O and/or N-comprising precursor $P_2$ when it is at or below 650° C. Alternately, monolayer 18 is only contacted with the O and/or N-comprising precursor $P_2$ when it is above 650° C. Regardless, in one embodiment monolayer 18 is contacted with the O and/or N-comprising precursor $P_2$ all of the time it is at the temperature T2, and in an alternate embodiment is contacted with the O and/or N-comprising precursor $P_2$ only some of the time it is at the temperature T2.

The temperature-increasing rate may be constant (i.e., within a 3.00° C. per second range, including exactly constant meaning held within 0.00° C./second variability, if any), or the temperature-increasing rate may not be constant. In one embodiment, the temperature-increasing rate is at least 40° C./per second, and in one embodiment is no more than 75° C./second. In one embodiment, the temperature-increasing takes no more than 6 seconds. In one such embodiment, the temperature T2 is at least 700° C. and the temperature-increasing takes no more than 6 seconds to get to the temperature T2. In one embodiment, the temperature-increasing takes no less than 3 seconds. In one embodiment the temperature T2 is at least 700° C. and the temperature-increasing takes no more than 3 seconds to get to the temperature T2. In one embodiment, an inert-gas purge of a chamber in which the ALD sequence occurs is conducted, and that inert-gas purge occurs at least in part during the temperature-increasing.

With Si-comprising monolayer 18 not having been allowed to be above 650° C. for more than 10 seconds, temperature of new outer substrate surface 22 is decreased from the temperature T2 to a lower temperature TL that is at least 50° C. lower than the minimum of the temperature T2 and is lower than or equal to 650° C. (e.g., a temperature-decreasing step [d] as referred to above). In one embodiment, the lower temperature TL is at least 150° C. lower than, in one embodiment at least 200° C. lower than, the minimum temperature T2. In one embodiment, the temperature T2 is within 10% in degrees C. of the maximum and the minimum of the temperature T2 during all of the contacting of outer substrate surface 14 with the Si-comprising precursor. In one embodiment, the lower temperature TL is the same as the temperature T1, in one embodiment is lower than the temperature T1, and in one embodiment is greater than the temperature T1. In one embodiment, the temperature-decreasing occurs with monolayer 18 not having been allowed to be above 650° C. for more than 5 seconds, and in one embodiment not having been allowed to be above 650° C. for more than 2 seconds.

The temperature-decreasing rate may be constant (i.e., within a 3.00° C. per second range, including exactly constant meaning held within 0.00° C./second variability, if any), or the temperature-decreasing rate may not be constant. In one embodiment, the temperature-decreasing is at a temperature-decreasing rate that is at least 40° C./second, and in one embodiment is no more than 75° C./second. In one embodiment, the temperature-decreasing is at a temperature-decreasing rate that is less than the temperature-increasing rate. In one such embodiment, the temperature-decreasing to the lower temperature TL takes no more than 30 seconds and in one embodiment takes no more than 6 seconds. In one embodiment, an inert-gas purge of a chamber in which the ALD sequence occurs is conducted, and that inert-gas purge occurs at least in part during the temperature-decreasing.

The example ALD sequence(s) as described above may be repeated until achieving a desired thickness of an insulative material 24. For example, FIGS. 5-8 show repeating such sequence one additional time, and wherein reaction-product-new-outer-substrate surface 22 becomes outer substrate surface 14 (now designated with numeral 14*a*) for such next-repeated sequence. Repeating of the sequence may occur more than once, and again each such sequence need not be exactly the same as any one or more previous sequence(s). Further, and for example and by way of example only, insulative material 24 may comprise both O and N [e.g., comprise an oxynitride] by varying precursor P2 composition in the repeated sequence(s).

In one embodiment in accordance with an issue that at least in part motivated the invention in forming thin insulative layers comprising one or both of oxygen and nitrogen, the sequence is repeated until no more than a total of 100 Angstroms of the insulative material is formed, and in one such embodiment until a total of the insulative material formed is no less than 10 Angstroms. In accordance with another issue that at least in part motivated the invention, an outermost region of the substrate when beginning the method comprises elemental-form Si, and all of the repeating of the sequence consumes no more than 2 Angstroms, if any, of said elemental-form Si (e.g., including in one embodiment wherein the repeating consumes no measurable quantity of the elemental-form Si).

In accordance with the above-described example ALD sequence(s), elements in addition to Si may be introduced such that the collective insulative material that is formed comprises Si and a metal element (e.g., $Si_xM_yOz$ and/or $Si_vM_xO_yN_z$, where "M" is by way of example any one or more of Hf, Zr, Bi, Al, Ti, Sr, La, Pr, etc.). As an example and in one embodiment, at least one of before and after the contacting of an outer substrate surface at the temperature T1 at or below 650° C. with the O and/or N-comprising precursor, the substrate is contacted with a metal-comprising precursor and the reaction product and the new outer surface is formed to comprise the metal from the metal-comprising precursor. Example metals "M" of the metal-comprising precursors, and by way of example only, include Hf, Zr, Bi, Al, Ti, Sr, La, and Pr. Some specific metal-comprising precursors include tetrakis(ethylmethylamino)hafnium, trimethyl alumina, $HfCl_4$, $Hf(CH_3)_4$, $HfI_4$, $Hf(NEtMe)_4$, tetrakis(dimethylamido)hafnium $Hf(NMe_2)_4$, tetrakis-(ethylmethylamido)hafnium $Hf(NMeEt)_4$, tetrakis(diethylamido)hafnium $Hf(NEt_2)_4$, $Hf(t-butoxide)_4$, $TaCl_4$, $Ta(OC_2H_5)_5$, tert-butylimido-tris-ethylmethylamido-tantalum, $TiCl_4$, $TiI_4$, $Ti(OC_2H_5)_4$, $Ti(OCH(CH_3)_2)_4$, $AlCl_3$, $Al(OC_2H_5)_3$, $Al(OCH (CH_3)_2)_3$, $Al(CH_3)_2Cl$, $Al(CH_3)_3$, Zr alkoxides such as $Zr(OC(CH_3)_3)_4$ and $Zr(OC(CH_3)_3)_2(dmae)_2$, $ZrCl_4$, $Zr(CH_3)_4$, tetrakis(dimethylamido)zirconium $Zr(NMe_2)_4$, tetrakis(ethylmethylamido)zirconium $Zr(NMeEt)_4$, tetrakis (diethyl-amido)zirconium $Zr(NEt_2)_4$, $Sr(thd)_2$, and beta-diketonate $Sr(thd)_2$, strontium bis(triisopropylcyclopentadienyl. Some metals M may be substituted for other stated metals M in the above specific examples.

In one such example, the contacting with the metal-comprising precursor occurs before the contacting with the O and/or N-comprising precursor and at the temperature T1 such that the new outer surface comprises the metal immediately upon formation of the reaction product having the new outer surface. Alternately, by way of example, the contacting with the metal-comprising precursor may occur after the contacting with the O and/or N-comprising precursor such that the reaction product having the new outer surface comprises the metal after and not before formation of the reaction product having the new outer surface. In one embodiment, the contacting with the metal-comprising precursor occurs before and after the contacting with the O and/or N-comprising precursor. Regardless, the contacting with the O and/or N-comprising precursor may be conducted within only a single one ALD sequence wherein the reaction product and new outer substrate surface are formed, or may occur in one or more repeated ALD sequence(s) wherein the metal-comprising precursor is substituted in such sequence(s) in place of the processing with respect to the Si-comprising precursor.

Figure 9:
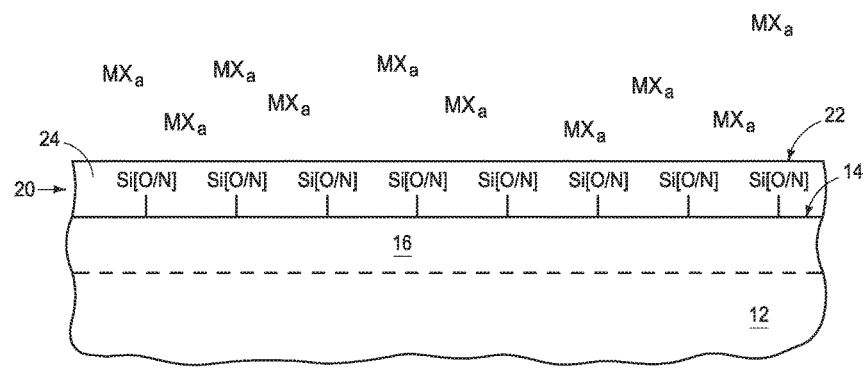
FIG. 9 is a diagrammatic cross-sectional view of a portion of a substrate in process in accordance with an embodiment of the invention

By way of example only, such an example is next-described with reference to FIGS. 9-12 which show continued example processing having occurred with respect to the substrate as shown in FIG. 4. Specifically, FIG. 9 shows the FIG. 4-substrate as having been processed to contact new outer substrate surface 22 of reaction-product-insulative material 24 with a metal-comprising precursor $MX_a$ ("M" being any one or more elemental metal[s]) at the temperature T1 to form a monolayer 30 (FIG. 10) comprising metal M from metal-comprising precursor $MX_a$ onto new outer substrate surface 22. The example metal-comprising precursor is shown as comprising molecular-like $MX_a$ having example molecular entities of M and X, and where "a" is any number (not necessarily an integer) greater than 0. Metal-comprising precursor $MX_a$ may be organic or inorganic, and may be electrically neutral, an ion, a radical, etc., and may be in any one or more of liquid, vapor, or plasma state(s). In one embodiment, the metal-comprising precursor is in a gaseous state, and in one embodiment is in a plasma state.

Figure 10:
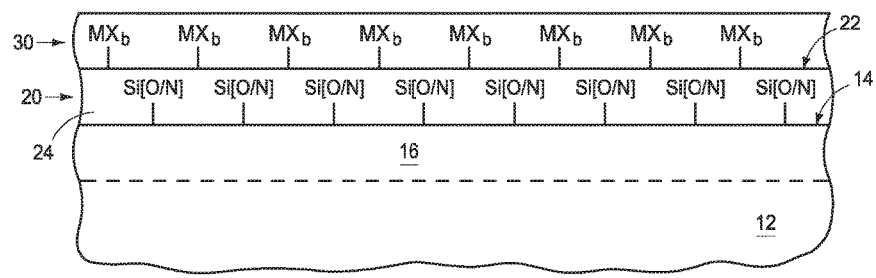
FIG. 10 is a view of the FIG. 9 substrate at a processing step subsequent to that shown by FIG. 9.

Metal-comprising precursor $MX_a$ of FIG. 9 is shown as having been attached to outer substrate surface 22 in FIG. 10 as an example species $MX_b$, for example where "b" might be some number (not necessarily an integer) which is a value from and inclusive of zero to some number less than "a". Accordingly, species $MX_b$ may be some altered form of $MX_a$, for example wherein the attaching is by one or more of adsorption and chemisorption. Alternately, the species attached to outer substrate surface 22 in FIG. 10 may be $MX_a$ (not shown), for example wherein attaching of the species occurs by one or more of physisorption or absorption.

Figure 11:
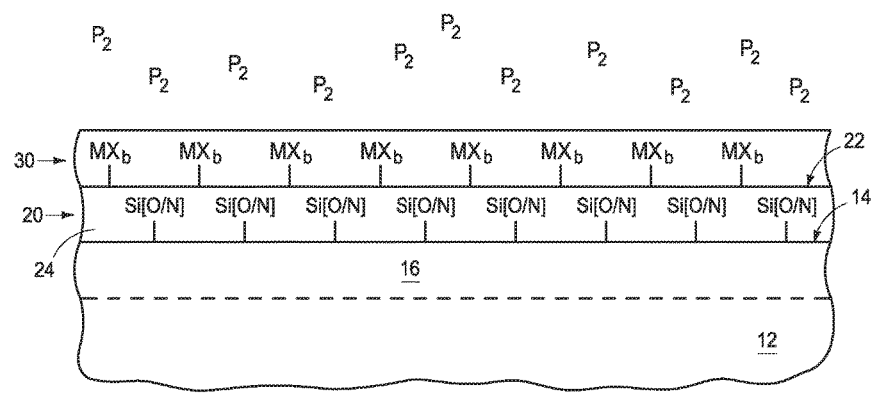
FIG. 11 is a view of the FIG. 10 substrate at a processing step subsequent to that shown by FIG. 10.

Thereafter, temperature of new outer substrate surface 22 and metal-comprising monolayer 30 thereon is increased to the temperature T2. The temperature-increasing of new outer substrate surface 22 and metal-comprising monolayer 30 thereon is conducted at a temperature-increasing rate (that may be the same or different as the previously-stated temperature-increasing rate) and takes no more than 10 seconds to get new outer substrate surface 22 and metal-comprising monolayer 30 thereon above 650° C. At the temperature T2, metal-comprising monolayer 30 is contacted with the O and/or N-comprising precursor (FIG. 11). Such reacts with metal-comprising monolayer 30 to form another reaction product 32 (FIG. 12) and another new outer substrate surface 36 that each comprise an insulative material 34 comprising the metal M from the metal-comprising monolayer and at least one of O and N from the O and/or N-comprising precursor $P_2$.

Figure 8:
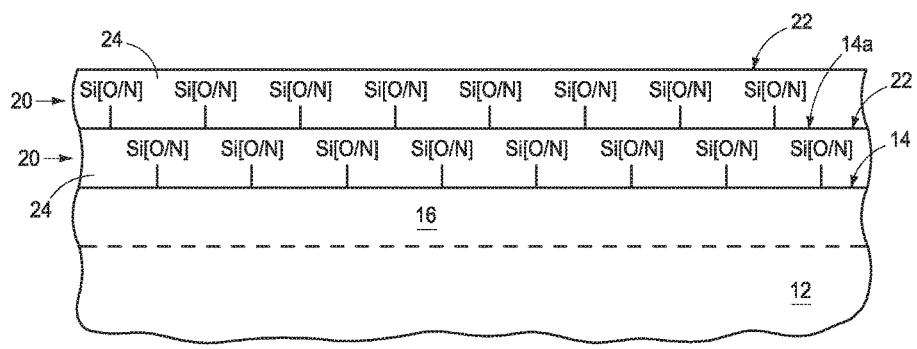
FIG. 8 is a view of the FIG. 7 substrate at a processing step subsequent to that shown by FIG. 7.
Figure 12:
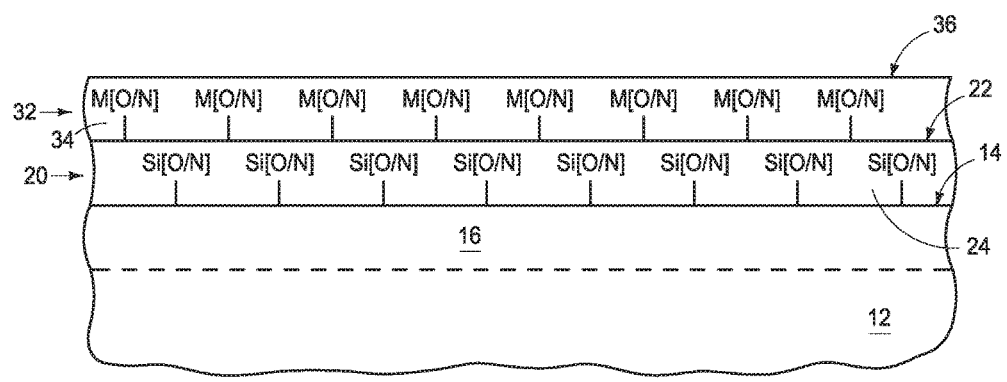
FIG. 12 is a view of the FIG. 11 substrate at a processing step subsequent to that shown by FIG. 11.

Each of the embodiments as shown in FIGS. 8 and 12, by way of example, show a construction comprising discrete/identifiable layers 20 (FIG. 8) and layers 20 and 32 (FIG. 12) resulting from an example single act of repeating an ALD sequence [a]-[d]. However, such example-depicted-discrete/identifiable layers 20/32 may not exist in a finished circuit construction and an interface between such depicted layers may essentially vanish or not manifest during practice of a method in accordance with embodiments of the invention. Further, and by way of example, insulative materials 24 and 34 in FIG. 12 may be considered as a composite insulative material 24/34, for example comprising at least one of $SiO_2$, $Si_3N_4$, and $Si_xO_yN_z$, and at least one of $MO_x$, $MN_x$, $MO_xN_y$. Further, composite insulative material 24/34 may be homogenous, for example resulting from an intermixing of M[O/N] and Si[O/N] during deposition and/or upon subsequent processing which may effectively intermix individual insulative materials 24 and 34 together. Regardless, a composite resultant insulative material 24/34 may alternately be non-homogenous.

Any other attribute(s) or aspect(s) as shown and/or described herein with respect to other embodiments may be used in the embodiments of FIGS. 9-12.

In one embodiment, a method comprises an ALD sequence comprising contacting an outer substrate surface (e.g., 14/14a) at a temperature T1 (regardless of whether at or below 650° C.) with a Si-comprising precursor (e.g., SiX$_a$) to form a monolayer (e.g., 18) comprising Si from the Si-comprising precursor onto the outer substrate surface. Temperature of the outer substrate surface and the Si-comprising monolayer thereon is increased to a temperature T2 that is at least 200° C. greater than a maximum of the temperature T1 (regardless of whether greater than 650° C.). The temperature-increasing is at a temperature-increasing rate that takes no more than 10 seconds to get the outer substrate surface and the Si-comprising monolayer thereon at least 200° C. above the maximum of the temperature T1. At the temperature T2, the Si-comprising monolayer is contacted with an O and/or N-comprising precursor (e.g., P$_2$) that reacts with the Si-comprising monolayer to form a reaction product (e.g., 20) and a new outer substrate surface (e.g., 22) that each comprise an insulative material (e.g., 24) comprising Si from the monolayer and at least one of O and N from the O and/or N-comprising precursor. With the Si-comprising monolayer not having been allowed to be at least 200° C. above the maximum temperature T1 for more than 10 seconds, temperature of the new outer substrate surface is decreased from the temperature T2 to a lower temperature TL that is at least 200° C. lower than a minimum of the temperature T2. Any other attribute(s) or aspect(s) as shown and/or described herein with respect to other embodiments may be used.

In one embodiment, a method comprises an ALD sequence comprising contacting an outer substrate surface (e.g., 14) at a temperature T1 (regardless of whether at or below 650° C.) with a first precursor (e.g., P$_1$ and regardless of whether comprising Si) to form a monolayer (e.g., 18) onto the outer substrate surface. Temperature of the outer substrate surface and the monolayer thereon is increased to a temperature T2 that is at least 200° C. greater than a maximum of the temperature T1 (regardless of whether greater than 650° C.). The temperature-increasing is at temperature-increasing rate that takes no more than 10 seconds to get the outer substrate surface and the monolayer thereon at least 200° C. above the maximum temperature T1. At the temperature T2, the monolayer is contacted with a second precursor (e.g., P$_2$ and regardless of whether containing at least one of O and N) that reacts with the monolayer to form a reaction product (e.g., 20 and/or 32) and a new outer substrate surface (e.g., 22/36) that each comprise a component (e.g., Si and/or M where the monolayer comprises Si and/or M) from the monolayer and a component from the second precursor (e.g., O and/or N where the second precursor comprises O and/or N). With the monolayer not having been allowed to be at least 200° C. above the maximum temperature T1 for more than 10 seconds, temperature of the new outer substrate surface is decreased from the temperature T2 to a lower temperature TL that is at least 200° C. lower than a minimum of the temperature T2. Any other attribute(s) or aspect(s) as shown and/or described herein with respect to other embodiments may be used.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another. In this document, "onto" means "directly on".

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

CONCLUSION

In some embodiments, a method comprises an ALD sequence including contacting an outer substrate surface at a temperature T1 with a first precursor to form a monolayer onto the outer substrate surface. Temperature of the outer substrate surface and the monolayer thereon is increased to a temperature T2 that is at least 200° C. greater than a maximum of the temperature T1. The temperature-increasing is at a temperature-increasing rate that takes no more than 10 seconds to get the outer substrate surface and the monolayer thereon at least 200° C. above the maximum temperature T1. At the temperature T2, the monolayer is contacted with a second precursor that reacts with the monolayer to form a reaction product and a new outer substrate surface that each comprise a component from the monolayer and a component from the second precursor. With the monolayer not having been allowed to be at least 200° C. above the maximum temperature T1 for more than 10 seconds, temperature of the new outer substrate surface is decreased from the temperature T2 to a lower temperature TL that is at least 200° C. lower than a minimum of the temperature T2.

In some embodiments, a method comprises an ALD sequence including contacting an outer substrate surface at a temperature T1 with a Si-comprising precursor to form a monolayer comprising Si from the Si-comprising precursor onto the outer substrate surface. Temperature of the outer substrate surface and the Si-comprising monolayer thereon is increased to a temperature T2 that is at least 200° C. greater than a maximum of the temperature T1. The temperature-increasing is at a temperature-increasing rate that takes no more than 10 seconds to get the outer substrate surface and the Si-comprising monolayer thereon at least 200° C. above the maximum temperature T1. At the temperature T2, the Si-comprising monolayer is contacted with an O and/or N-comprising precursor that reacts with the Si-comprising monolayer to form a reaction product and a new outer substrate surface that each comprise an insulative material comprising silicon from the monolayer and at least one of O and N from the O and/or N-comprising precursor. With the Si-comprising monolayer not having been allowed to be at least 200° C. above the maximum temperature T1 for more than 10 seconds, temperature of the new outer substrate surface from the temperature T2 is decreased to a lower temperature TL that is at least 200° C. lower than a minimum of the temperature T2.

In some embodiments, a method comprises an ALD sequence including contacting an outer substrate surface at a temperature T1 at or below 650° C. with a Si-comprising precursor to form a monolayer comprising Si from the Si-comprising precursor onto the outer substrate surface. Temperature of the outer substrate surface and the Si-comprising monolayer thereon is increased to a temperature T2 that is at least 100° C. greater than a maximum of the temperature T1 and is greater than 650° C. The temperature-increasing is at a temperature-increasing rate that takes no more than 10 seconds to get the outer substrate surface and the Si-comprising monolayer thereon above 650° C. At the temperature T2, the Si-comprising monolayer is contacted with an O and/or N-comprising precursor that reacts with the Si-comprising monolayer to form a reaction product and a new outer substrate surface that each comprise an insulative material comprising silicon from the monolayer and at least one of O and N from the O and/or N-comprising precursor. With the Si-comprising monolayer not having been allowed to be above 650° C. for more than 10 seconds, temperature of the new outer substrate surface is decreased from the temperature T2 to a lower temperature TL that is at least 50° C. lower than a minimum of the temperature T2 and is lower than or equal to 650° C.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method comprising the following ALD sequence:
    contacting an outer substrate surface at a temperature T1 at or below 650° C. with a Si-comprising precursor to form a monolayer comprising Si from the Si-comprising precursor onto the outer substrate surface;
    increasing temperature of the outer substrate surface and the Si-comprising monolayer thereon to a temperature T2 that is at least 100° C. greater than a maximum of the temperature T1 and is greater than 650° C., the temperature-increasing being at a temperature-increasing rate that takes no more than 10 seconds to get the outer substrate surface and the Si-comprising monolayer thereon above 650° C.;
    at the temperature T2, contacting the Si-comprising monolayer with an O and/or N-comprising precursor that reacts with the Si-comprising monolayer to form a reaction product and a new outer substrate surface that each comprise an insulative material comprising silicon from the monolayer and at least one of O and N from the O and/or N-comprising precursor; and
    with the Si-comprising monolayer not having been allowed to be above 650° C. for more than 10 seconds, decreasing temperature of the new outer substrate surface from the temperature T2 to a lower temperature TL that is at least 50° C. lower than a minimum of the temperature T2 and is lower than or equal to 650° C.

2. The method of claim 1 being devoid of contacting the outer substrate surface with any Si-comprising precursor at a temperature above 650° C.

3. The method of claim 1 wherein the temperature T1 is no lower than 20° C.

4. The method of claim 1 comprising repeating said sequence and until no more than a total of 100 Angstroms of the insulative material is formed.

5. The method of claim 4 comprising repeating said sequence until the total of the insulative material is no less than 10 Angstroms.

6. The method of claim 4 wherein an outermost region of the substrate when beginning said method comprises elemental-form Si, all of the repeating consuming no more than 2 Angstroms, if any, of said elemental-form Si.

7. The method of claim 6 wherein all of the repeating consumes no measurable quantity of said elemental-form Si.

8. The method of claim 1 comprising at least one of before and after the contacting with the O and/or N-comprising precursor, contacting the substrate with a metal-comprising precursor and forming the reaction product and the new outer surface to comprise the metal from the metal-comprising precursor.

9. The method of claim 8 wherein the contacting with the metal-comprising precursor occurs before the contacting with the O and/or N-comprising precursor and at the temperature T1 such that the new outer surface comprises the metal immediately upon formation of the reaction product having the new outer surface.

10. The method of claim 8 wherein the contacting with the metal-comprising precursor occurs after the contacting with the O and/or N-comprising precursor such that the reaction product having the new outer surface comprises the metal after and not before formation of the reaction product having the new outer surface.

11. The method of claim 10 wherein,
the contacting with the metal-comprising precursor occurs at the temperature T1 and forms a monolayer comprising metal from the metal-comprising precursor onto the new outer substrate surface;
thereafter, increasing temperature of the new outer substrate surface and the metal-comprising monolayer thereon to the temperature T2, the temperature-increasing of the new outer substrate surface and the metal-comprising monolayer thereon being at a temperature-increasing rate and taking no more than 10 seconds to get the new outer substrate surface and the metal-comprising monolayer thereon above 650° C.; and
at the temperature T2, contacting the metal-comprising monolayer with the O and/or N-comprising precursor that reacts with the metal-comprising monolayer to form another reaction product and another new outer substrate surface that each comprise the insulative material comprising the metal from the metal-comprising monolayer and at least one of O and N from the O and/or N-comprising precursor.

12. The method of claim 8 wherein the contacting with the metal-comprising precursor occurs before and after the contacting with the O and/or N-comprising precursor.

13. The method of claim 1 wherein the temperature T1 is no greater than 500° C.

14. The method of claim 13 wherein the temperature T1 is no less than 350° C. during at least some of the contacting the outer substrate surface with the Si-comprising precursor to form the monolayer.

15. The method of claim 13 wherein the temperature T1 is no less than 350° C. during all of the contacting the outer substrate surface with the Si-comprising precursor to form the monolayer.

16. The method of claim 14 wherein the lower temperature TL is at least 200° C. lower than the minimum of the temperature T2.

17. The method of claim 13 wherein the temperature T1 is at least 100° C. during all of the contacting the outer substrate surface with the Si-comprising precursor to form the monolayer.

18. The method of claim 1 wherein the lower temperature TL is at least 150° C. lower than the minimum of the temperature T2.

19. The method of claim 1 wherein the temperature T1 is constant during all of the contacting of the outer substrate surface with the Si-comprising precursor.

20. The method of claim 1 wherein the temperature T1 is not constant during all of the contacting of the outer substrate surface with the Si-comprising precursor.

21. The method of claim 20 wherein the maximum and a minimum of the temperature T1 during most of the contacting of the outer substrate surface with the Si-comprising precursor are each more than 10% in degrees C. from the middle value between the maximum and the minimum of the temperature T1.

22. The method of claim 1 wherein the maximum and a minimum of the temperature T1 during all of the contacting of the outer substrate surface with the Si-comprising precursor are each within 10% in degrees C. from the middle value between the maximum and the minimum of the temperature T1.

23. The method of claim 1 wherein the temperature T2 is at least 200° C. above the maximum of the temperature T1.

24. The method of claim 23 wherein the temperature T2 is at least 300° C. above the maximum of the temperature T1.

25. The method of claim 1 wherein the temperature T2 is at least 750° C.

26. The method of claim 1 wherein the temperature T2 is no more than 1,000° C.

27. The method of claim 1 wherein the temperature T2 is constant during all of the contacting of the monolayer with the O and/or N-comprising precursor.

28. The method of claim 1 wherein the temperature T2 is not constant during all of the contacting of the monolayer with the O and/or N-comprising precursor.

29. The method of claim 28 wherein the minimum and a maximum of the temperature T2 during most of the contacting of the monolayer with the O and/or N-comprising precursor are each more than 10% in degrees C. from the middle value between the maximum and the minimum of the temperature T2.

30. The method of claim 1 wherein the maximum and a minimum of the temperature T2 during all of the contacting of the monolayer with the O and/or N-comprising precursor are each within 10% in degrees C. from the middle value between the maximum and the minimum of the temperature T2.

31. The method of claim 1 comprising contacting the monolayer with the O and/or N-comprising precursor when it is at or below 650° C.

32. The method of claim 1 comprising only contacting the monolayer with the O and/or N-comprising precursor when it is above 650° C.

33. The method of claim 1 comprising contacting the monolayer with the O and/or N-comprising precursor all of the time it is at the temperature T2.

34. The method of claim 1 comprising contacting the monolayer with the O and/or N-comprising precursor only some of the time it is at the temperature T2.

35. The method of claim 1 wherein the temperature-increasing rate is constant.

36. The method of claim 1 wherein the temperature-increasing rate is at least 40° C./second.

37. The method of claim 36 wherein the temperature-increasing rate is no more than 75° C./second.

38. The method of claim 1 wherein the temperature-increasing takes no more than 6 seconds.

39. The method of claim 38 wherein the temperature T2 is at least 700° C., and the temperature-increasing taking no more than 6 seconds is to the temperature T2.

40. The method of claim 1 wherein the temperature-increasing takes no less than 3 seconds.

41. The method of claim 40 wherein the temperature T2 is at least 700° C., and the temperature-increasing taking no more than 3 seconds is to the temperature T2.

42. The method of claim 1 wherein the temperature-decreasing occurs with the monolayer not having been allowed to be above 650° C. for more than 5 seconds.

43. The method of claim 42 wherein the temperature-decreasing occurs with the monolayer not having been allowed to be above 650° C. for more than 2 seconds.

44. The method of claim 1 wherein,
the temperature T1 is within 10% in degrees C. of the maximum and a minimum of the temperature T1 during all of the contacting of the outer substrate surface with the Si-comprising precursor; and
the lower temperature TL is the same as the temperature T1.

45. The method of claim 1 wherein,
the temperature T1 is within 10% in degrees C. of the maximum and a minimum of the temperature T1 during all of the contacting of the outer substrate surface with the Si-comprising precursor; and
the lower temperature TL is lower than the temperature T1.

46. The method of claim 1 wherein,
the temperature T1 is within 10% in degrees C. of the maximum and a minimum of the temperature T1 during all of the contacting of the outer substrate surface with the Si-comprising precursor; and
the lower temperature TL is greater than the temperature T1.

47. The method of claim 1 wherein the temperature-decreasing is at a temperature-decreasing rate that is at least 40° C./second.

48. The method of claim 47 wherein the temperature-decreasing rate is no more than 75° C./second.

49. The method of claim 1 wherein the temperature-decreasing is at a temperature-decreasing rate that is less than the temperature-increasing rate.

50. The method of claim 49 wherein the temperature-decreasing to the lower temperature TL takes no more than 30 seconds.

51. The method of claim 50 wherein the temperature-decreasing to the lower temperature TL takes no less than 6 seconds.

52. The method of claim 1 wherein the O and/or N-comprising precursor comprises O and the insulative material of the reaction product and the new outer substrate surface comprises O from the O-comprising precursor.

53. The method of claim 1 wherein the O and/or N-comprising precursor comprises N and the insulative material of the reaction product and the new outer substrate surface comprises N from the N-comprising precursor.

54. The method of claim 1 wherein the O and/or N-comprising precursor comprises O and N, the insulative material of the reaction product and the new outer substrate surface comprise O and N from the O and N-comprising precursor.

55. The method of claim 1 further comprising an inert-gas purge of a chamber in which the ALD sequence occurs, the inert-gas purge occurring at least in part during the temperature-increasing.

56. The method of claim 1 further comprising an inert-gas purge of a chamber in which the ALD sequence occurs, the inert-gas purge occurring at least in part during the temperature-decreasing.

57. A method comprising the following ALD sequence:
contacting an outer substrate surface at a temperature T1 with a Si-comprising precursor to form a monolayer comprising Si from the Si-comprising precursor onto the outer substrate surface;
increasing temperature of the outer substrate surface and the Si-comprising monolayer thereon to a temperature T2 that is at least 200° C. greater than a maximum of the temperature T1, the temperature-increasing being at a temperature-increasing rate that takes no more than 10 seconds to get the outer substrate surface and the Si-comprising monolayer thereon at least 200° C. above the maximum temperature T1;
at the temperature T2, contacting the Si-comprising monolayer with an and/or N-comprising precursor that reacts with the Si-comprising monolayer to form a reaction product and a new outer substrate surface that each comprise an insulative material comprising silicon from the monolayer and at least one of O and N from the O and/or N-comprising precursor; and
with the Si-comprising monolayer not having been allowed to be at least 200° C. above the maximum temperature T1 for more than 10 seconds, decreasing temperature of the new outer substrate surface from the temperature T2 to a lower temperature TL that is at least 200° C. lower than a minimum of the temperature T2.

58. A method comprising the following ALD sequence:
contacting an outer substrate surface at a temperature T1 with a first precursor to form a monolayer onto the outer substrate surface;
increasing temperature of the outer substrate surface and the monolayer thereon to a temperature T2 that is at least 200° C. greater than a maximum of the temperature T1, the temperature-increasing being at a temperature-increasing rate that takes no more than 10 seconds to get the outer substrate surface and the monolayer thereon at least 200° C. above the maximum temperature T1;
at the temperature T2, contacting the monolayer with a second precursor that reacts with the monolayer to form a reaction product and a new outer substrate surface that each comprise a component from the monolayer and a component from the second precursor; and
with the monolayer not having been allowed to be at least 200° C. above the maximum temperature T1 for more than 10 seconds, decreasing temperature of the new outer substrate surface from the temperature T2 to a lower temperature TL that is at least 200° C. lower than a minimum of the temperature T2.

* * * * *